United States Patent
Bhattacharya et al.

(10) Patent No.: US 8,401,828 B1
(45) Date of Patent: Mar. 19, 2013

(54) METHODS AND SYSTEMS FOR ANALOG OBJECT FETCH IN MIXED-SIGNAL SIMULATION

(75) Inventors: Prabal K. Bhattacharya, Cupertino, CA (US); Timothy Martin O'Leary, Cupertino, CA (US); William Scott Cranston, Haverhill, MA (US); Walter Hartong, Isen (DE)

(73) Assignee: Cadence Design Systems, Inc., San Jose, CA (US)

( * ) Notice: Subject to any disclaimer, the term of this patent is extended or adjusted under 35 U.S.C. 154(b) by 281 days.

(21) Appl. No.: 12/837,406

(22) Filed: Jul. 15, 2010

(51) Int. Cl.
*G06F 17/50* (2006.01)

(52) U.S. Cl. .................. 703/2; 703/14; 703/15; 716/104

(58) Field of Classification Search ................ 703/2, 14, 703/15; 716/4, 104
See application file for complete search history.

(56) References Cited

U.S. PATENT DOCUMENTS

| | | | |
|---|---|---|---|
| 6,606,588 B1 * | 8/2003 | Schaumont et al. | 703/15 |
| 7,006,960 B2 * | 2/2006 | Schaumont et al. | 703/15 |
| 2003/0216901 A1 * | 11/2003 | Schaumont et al. | 703/13 |
| 2008/0222580 A1 * | 9/2008 | Banerjee et al. | 716/4 |
| 2008/0222581 A1 * | 9/2008 | Banerjee et al. | 716/4 |
| 2010/0049495 A1 * | 2/2010 | Francken et al. | 703/14 |

* cited by examiner

*Primary Examiner* — Thai Phan
(74) *Attorney, Agent, or Firm* — Kenyon & Kenyon LLP

(57) ABSTRACT

Systems and methods for simulating and verifying an analog mixed signal design provide an analog mixed signal testbench configured to verify analog parameters of the design. The testbench can include a mechanism to fetch a value of an analog object in an analog portion of a mixed signal design. The testbench mechanism can include an argument specifying the name of the object and the analog quantity to be fetched for that object. The testbench can retrieve estimated values and can further specify timing constraints specifying absolute times or events at which values are to be measured and returned.

22 Claims, 6 Drawing Sheets

METHODS AND SYSTEMS FOR ANALOG OBJECT FETCH IN MIXED-SIGNAL SIMULATION

TECHNICAL FIELD

The present invention generally relates to circuit simulation, and more particularly, some embodiments relate to analog mixed signal circuit simulation and verification.

DESCRIPTION OF THE RELATED ART

The trend in mixed-signal design is rapidly evolving beyond traditional analog/mixed-signal (AMS) to large mixed-signal system-on-chip (SoC) designs that are the heart of today's advanced devices. As designers continue to develop ever-larger mixed-signal SoC designs, there is a growing need for higher levels of automation to implement and verify the vast amounts of digital control and processing logic as well as to verify mixed-signal features of the SoC that are either influenced by or influence the digital control and processing logic.

AMS designs include more digital logic than ever before, and SoC designs now include more and more analog components. Just as timing, die size, and power must be considered together, analog and digital design interdependency is expanding at a rapid rate. Nearly every electronics product today is a multi-function product, requiring massive amounts of processing power to crunch data from other systems and from components such as antennas, filters, sensors, and interfaces. This fusion of digital processing and analog components is presenting new challenges to older design methodologies.

Advanced chip design has raised the ante at every process node. New challenges include implementing complex analog/digital interactions, compensating for process variation, managing ever-more complex design rules, and handling extremely large designs efficiently. The conventional "divide-and-conquer" approach to AMS design and verification no longer works for today's more complex designs. At 65 nm and below, more than 50 percent of design re-spins result from mixed-signal-related design errors. Mask re-spin costs can be in the millions of dollars, but this cost can be minuscule when compared to the cost of missing a market window.

A complete mixed-signal. SoC usually involves a fairly complex combination of integrated blocks that can involve different languages and levels of abstraction. It is not uncommon for a mixed-signal. SoC configuration to utilize multiple languages such as, for example, Verilog, SystemVerilog, SystemC, Verilog-AMS, VHDL, VHDL-AMS, SPICE, Verilog-A. Adding to the complexity is the reality that the configuration is ever changing, causing the verification engineer to simulate different configuration variations of the design. This can impact the testbench and requiring time-consuming testbench modifications and iterations.

Common approaches for AMS SoC verification have included: Using a Verilog hierarchical name and applying the appropriate access function; using a system task to return the calculated current the named terminal; and using instances that let the user fetch digital and analog values of a continuous and discrete net, respectively. Conventional solutions offer the flexibility of specifying the access function of any continuous discipline in a discrete context. However, such access only considers the potential or flow quantities of an object. This does not access the value of a parameter or power dissipated by an instance, which are frequently utilized by mixed-signal verification applications.

The Verilog-AMS language semantic for accessing objects belonging to continuous domain from discrete contexts suggests that if the analog solver does not have a solution at the requested time (as specified by the discrete event driven engine), then the value returned to the discrete engine would be calculated by interpolating the value of the requested object between the last accepted solution point of the analog solver and the requested time. This interpolation, independent of the actual method of interpolation chosen, can introduce inaccuracy in the value as seen by the discrete engine.

Additionally, with conventional systems, there are limitations associated with returning requested quantities from SPICE for specified objects belonging to the analog part of a design. Furthermore, systems that convert continuous quantities in the continuous domain to the discrete domain typically require testbench modifications by insertion of these 'synthetic' instances and only serve the purpose of bringing the cross-domain values in the continuous assignment scope by driving values into a net.

BRIEF SUMMARY OF EMBODIMENTS OF THE INVENTION

Referring to the traits of an SOC configuration, it is often useful for a verificatio engineer to be able to fetch the value of an object belonging to the continuous domain by way of specifying its hierarchical name. Such values can be important for a verification methodology involving mixed-signal since these values can be programmed to participate in: procedural statement of a discrete event based hardware language such as Verilog, SystemVerilog or VHDL; Boolean expression layer of PSL or SVA (SystemVerilog Assertion); Coverage expressions in System Verilog; and Verification Units in PSL or SystemVerilog.

Such a value access mechanism according to various embodiments of the invention can be implemented to transcend language boundaries in a multi-language, hierarchical SOC design. Additional embodiments can be implemented to call a value fetch routine in a procedural statement scope, including procedural assignments with the value being a reg or a variable. Also, the discrete solver, which is a client for the value fetch functionality, in some embodiments has the ability to choose between interpolated value and accurate value as returned by the analog solver. In other words, the requester of the value of an analog object can be provided with the ability to force a solution of the analog solver at a timepoint of its choosing.

In various embodiments, the value fetch functionality can be customized to access quantities such as, for example, quantities associated with an analog object like Voltage, Current, Input, Output or OpPoint parameter of a device, or power. In further embodiments, the value fetch routine can be called from within Verilog, SystemVerilog, Verilog-AMS, VHDL, VHDL-AMS, SystemC, Specman/e and Verilog-a (used in pure analog simulator) scopes. Preferably, functionality is able to work on vectors (objects with width greater than one). For example, while in one embodiment, the functionality is configured to fetch the value of scalar objects, other embodiments also allow the value fetch routine to be called on a vector with each constituent bit being called in sequence.

In some embodiments, the testbench can be configured to retrieve values that are estimated such as, for example, by extrapolation or interpolation or by other estimation techniques. However, it is often the case that the testbench environment would rather have the control to specify when such interpolated values are acceptable and when they are not, and an actual solution needs to be forced in the analog solver, thereby guaranteeing an accurate value of the object. The mixed-signal interaction aspect of the language does not currently provide any means of achieving this effect.

Accordingly, systems and methods for simulating and verifying an analog mixed signal design provide an analog mixed signal testbench configured to verify analog parameters of the design. The testbench can include a fetch command having a first argument specifying an analog object to be fetched from an analog block in the analog mixed signal design; a validation argument having an argument to test the existence of the object specified by the fetch command as a condition precedent to performing a fetch operation in response to the fetch command; a quantity argument specifying a quantity for the analog object to be fetched and returned for verification by the test bench; and a verification rule to test the quantity returned to the test bench for verification.

The analog mixed signal testbench can also include a timing constraint specifying a timing event at which the specified quantity is to be fetched from a specified object. The timing constraint can provide a specification of an absolute time in a simulation or the occurrence of an event such as, for example, a threshold event, a rising or falling edge event or a node quantity. With a timing constraint specified, the analog solver can be configured to return the value of a specified analog object at the time or times specified by the timing constraint or constraints. During execution, if the testbench requests an analog object value but a timing constraint is not specified, or if a fetch is issued when a specified timing constraint is not true, the analog simulator can be configured to return an estimated value. The estimated value can be determined, for example, by the analog solver extrapolating the value from a point in time at which the object value was measured, or by interpolating the value between a known measurement time and a speculated value at a future time.

In another embodiment, a system design tool is provided for simulating and verifying an analog mixed signal circuit design including a memory configured to store program instructions; and a processor coupled to the memory and configured to receive and execute the program instructions, wherein the program instructions comprise an analog mixed signal testbench configured to verify analog parameters of an analog circuit in an analog mixed signal design. The testbench can include, for example: a fetch command embodied on a computer readable physical medium wherein the fetch command comprises a first argument specifying an analog object to be fetched from an analog block in the analog mixed signal design; a validation argument embodied on the computer readable physical medium wherein the validation argument comprises an argument to test the existence of the object specified by the fetch command as a condition precedent to performing a fetch operation in response to the fetch command; a quantity argument embodied on the computer readable physical medium specifying a quantity for the analog object to be fetched and returned for verification by the test bench; and a verification rule embodied on the computer readable physical medium to test the quantity returned to the test bench for verification.

The system design tool can further include a timing constraint embodied on the computer readable physical medium specifying a timing event at which the specified quantity is to be fetched from a specified object. The timing constraint can include specification of an absolute time in a simulation or the occurrence of an event, and the event can include a threshold event, a rising or falling edge event or a node quantity. With a timing constraint specified, the analog solver can be configured to return the value of a specified analog object at the time or times specified by the timing constraint or constraints. During execution, if the testbench requests an analog object value but a timing constraint is not specified, or if a fetch is issued when a specified timing constraint is not true, the analog simulator can be configured to return an estimated value. The estimated value can be determined, for example, by the analog solver extrapolating the value from a point in time at which the object value was measured, or by interpolating the value between a known measurement time and a speculated value at a future time.

In further embodiments, a computer readable physical medium includes computer executable instructions stored thereon, the computer executable instructions comprising a testbench adapted to cause a computer to: fetch an analog object in an analog block in the analog mixed signal design; test the existence of the object specified by the fetch command as a condition precedent to performing a fetch operation in response to a fetch command; determine a quantity for the analog object to be fetched and returned for verification by the test bench; and test the quantity returned to the test bench for verification. The testbench can be further adapted to specify a timing event at which the specified quantity is to be fetched from a specified node. The timing constraint can include specification of an absolute time in a simulation or the occurrence of an event, such as, for example, a threshold event, a rising or falling edge event or a node quantity. Likewise, the testbench is further adapted to receive an estimated value of the quantity, the estimate calculated based on an actual value for the quantity.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following Figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The Figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THIS INVENTION

The present invention relates generally to circuit simulation, and more particularly, some embodiments relate to analog mixed signal simulation and verification. According to various embodiments of the systems and methods described herein, one or more commands or arguments can be provided and included in a testbench to perform verification of analog effects in an analog mixed signal design or in a design containing digital, analog and analog mixed signal blocks. The commands can be provided to identify and call objects in the continuous space so that continuous values of various quantities can be measured and verified. These quantities can include quantities of objects belonging to the continuous time domain such as, for example, potential, flow, parameter, power, and so on. Additionally, commands can be included to validate the object and the associated function before the value is fetched. Accordingly, in some embodiments, the testbench can remain valid even if a design changes over time. This can include, for example, changes in design configuration during verification where one or more blocks that were previously implemented in the discrete time domain have changed to a continuous domain implementation. Further, embodiments can be included wherein timing specifications are provided to determine absolute values of a continuous function at a specified epoch or event. Likewise, embodiments can be included wherein extrapolated or otherwise estimated values are fetched for assertion.

Figure 1:
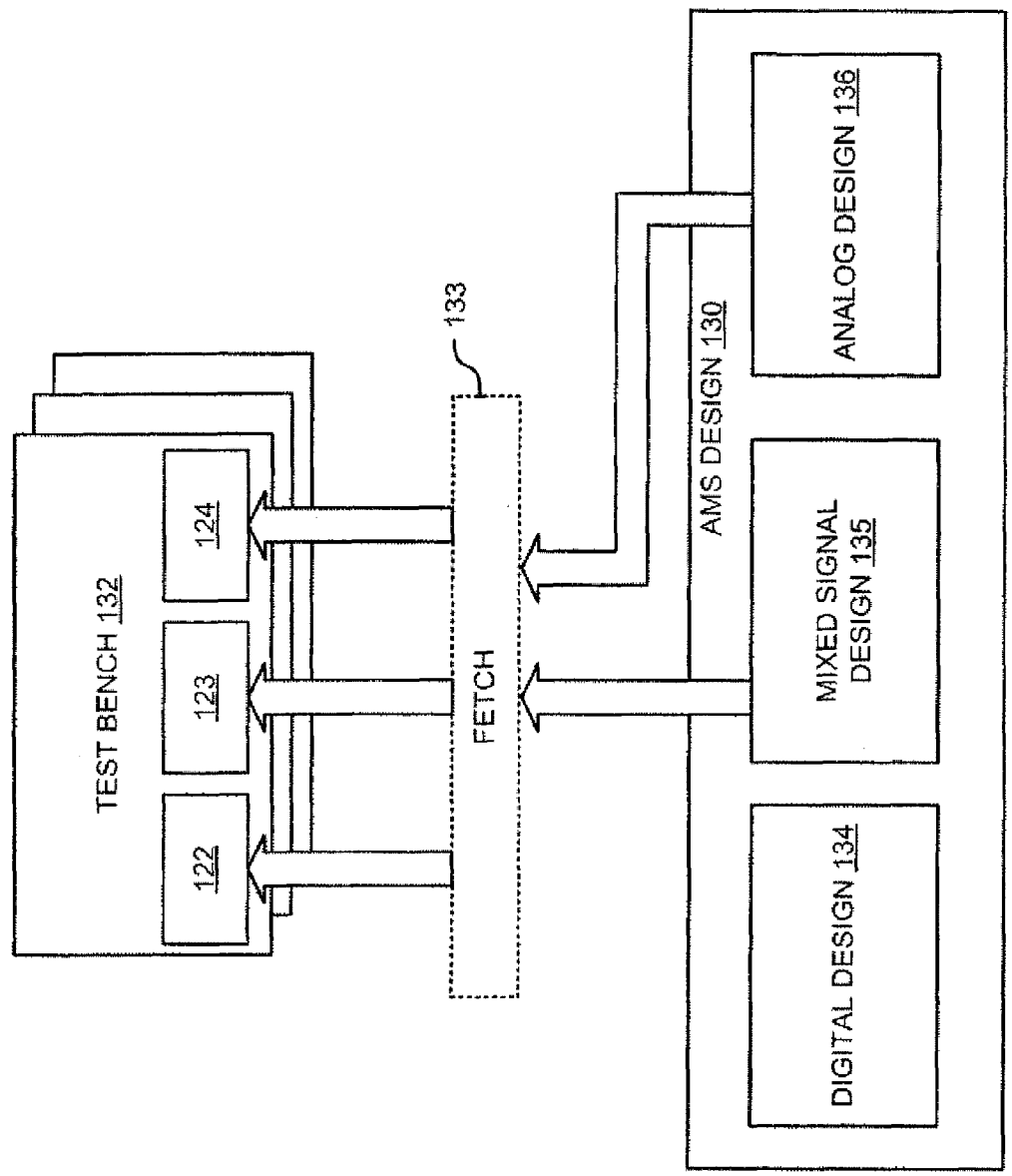
FIG. 1 is a diagram illustrating an example of analog mixed signal design verification accordance with one embodiment of the invention.

FIG. 1 is a diagram illustrating an example of analog mixed signal design verification in accordance with one embodiment of the invention. In the example illustrated in FIG. 1, a testbench 132 is provided to perform verification of an analog mixed signal design 130. Although the analog mixed signal design may be any of a number of analog mixed signal configurations or designs, the example mixed-signal design 130 illustrated in FIG. 1 includes digital blocks 134, analog/RF blocks 136, and mixed signal blocks 135. For example, the analog mixed signal design 130 can be that of an electronic device that includes analog/RF blocks such as a radio transceiver, an audio block, a Bluetooth® radio, a phase locked loop (PLL) and so on. In furtherance of this example, digital components might include a communication processor, a digital signal processor, an image processor, and an application processor. Analog mixed signal components might include a modem, a WiFi interface, a video interface, analog-to-digital and digital-to-analog converters, and so on.

Conventional test benches utilized to perform design verification and their operation are well known to those skilled in the art. The testbench 132 according to various embodiments of the invention, can be configured to include a fetch function that can be used to validate and test quantities associated with nodes or components of analog circuitry. This can include, for example, nodes in analog design 136 as well as analog nodes in a mixed signal design 135. In one embodiment, the testbench 132 is configured with a fetch command that generates a fetch request 133 to the design such as to the analog mixed signal design 130. In the illustrated example, the testbench 132 includes multiple blocks: a block to do assertions 122, a block to check coverage 123 and procedural code 124. In various embodiments, a fetch call can occur in any of these contexts.

Figure 2:
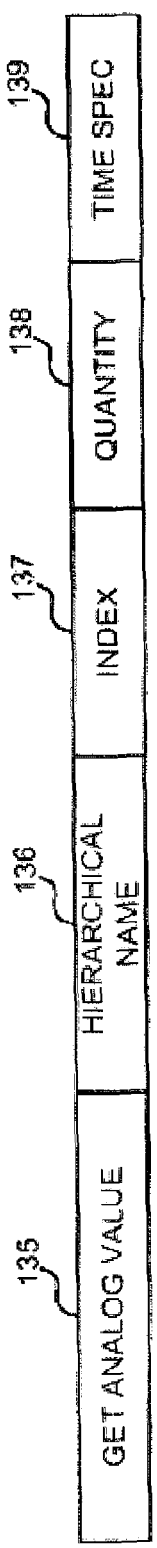
FIG. 2 is a diagram illustrating an example of a fetch command in accordance with one embodiment of the invention.

An example embodiment of a fetch command is illustrated in FIG. 2. As the example in FIG. 1 illustrates, embodiments of the fetch function can include commands for assertions as well as coverage items to verify main analog blocks such as band gap cells, oscillators, voltage regulators and the like. Assertions can be used to verify properties of nodes traces and can provide checks against unwanted conditions in analog circuits that are temporal in nature. In other words, for example, assertions can be used to test conditions that must hold true. Coverage evaluations can be used to evaluate analog metrics found in a mixed signal environment and are often configured to go through numerous combinations so the results can be measured over a range of conditions. For example, a stimulus can be driven through a randomly generated series of conditions and the system can evaluate the success/failure ratio across this range. Further, based on the coverage of a certain conditions occurring or not occurring, the testbench developer may wish to modify the stimulus or create new test conditions to drive the design into newer states.

FIG. 2 is a diagram illustrating an example of a fetch command in accordance with one embodiment of the invention. Referring now to FIG. 2, in this example, the fetch command includes fields such as a get analog value system task 135, a hierarchical name field 136, an index field 137, a quantity field 138, and a time specification field 139. One example of the syntax for this command is $cds_get_analog_value(hierarchical_name[, optional index[, optional quantity qualifier[, optional time_spec]]]).

The get analog value system task 135 can be used to specify that the fetch command is a command to fetch an analog quantity. Typically, this can be an analog quantity from an analog block in a design including an analog block such as a hierarchical design that includes digital and analog blocks.

The hierarchical name field 136 can be configured to identify the hierarchical name of the object for which the quantity is to be obtained. In one embodiment, the name can be specified as an absolute name or a relative name and can be configured to conform to the syntax and semantics of hierarchical names as defined by, for example, the Verilog 2005 LRM. In the embodiment illustrated, if the object is a vector, the index field 137 can be used to select a specific bit of the vector whose value is to be fetched.

The quantity field 138 can be used to specify the quantity to be obtained by the fetch command. In various embodiments, the quantity to be obtained can be that of potential, flow, power, and parameter. In some embodiments, the command can be implemented such that if no quantity is specified, a default quantity is presumed. For example, in one embodiment, if no quantity is specified, potential is assumed.

The time spec argument 139 can be included and can be configured to provide the discrete time solver with an ability to fetch accurate values from the continuous domain. This can be advantageous in that it can be configured to fetch accurate values that are not currently possible with conventional mixed-signal languages. In some embodiments, time spec 139 is a variable argument so that the user can pass an arbitrary number of values in a list such as a space-separated list.

One embodiment of the invention allows the time spec field 139 to specify an absolute time or an event. For example, the absolute time specified can have the same effect as adding an @timer event (for example, as specified by the Verilog-AMS 2.3 Language Reference Manual) to the analog block of the target module, and can force the analog block to return a solution point at the specified time. The event specification can be configured to have the same effect as adding an analog event expression to the analog block of the target module, forcing the analog solver to create a solution point when the specified event is triggered. For example, the event specification can specify event occurrences such as an above threshold expression a cross event expression, and so on.

Although not illustrated, additional commands can be utilized to validate the fetch command in advance of execution of the fetch command. For example, another command can be used to determine whether the hierarchical name specified by the fetch command exists. One example of this command is in the form of $cds_analog_is_valid( ), and can be included in the testbench and called prior to calling the fetch command. Accordingly, a validation command such as this can be utilized to determine whether a fetch command should even be executed. Thus, a testbench can be configured in advance, and utilize validation commands such as this to avoid errors that might otherwise be caused by subsequent design modifications.

As another example, another command can be used to determine whether the object referred to by the hierarchical name is owned by the analog solver. In other words, this command can be used to verify that the object referred to by the hierarchical name belongs to the continuous domain. Accordingly, this command can also be included in the testbench to check that the object is owned by the analog solver before the object is called by the fetch command. One example of this command is $cds_analog_exists( ). The command can be configured to return a yes/no value depending on whether the object is owned by the continuous time solver.

For example, the function to test existence of an object can take the form of $cds_analog_is_valid(hierarchical_name[, optional index[, optional quantity qualifier]]) and can be configured to return a value of "yes" or "no." The hierarchical name can be in pure Verilog syntax, or can contain VHDL-specific syntax (like: for hierarchical delimiter, {=/=} for index specifier, leading and trailing backslash (\) for escaped name) for mixed-language designs. In one embodiment, the command can be implemented such that if quantity qualifier is not specified, it is assumed that the hierarchical name is a net (and the user is interested in the voltage across the net and ground). In another embodiment, for a scalar object, index, if specified, is ignored.

An example of testing for the object that is referenced can be as listed in Table 1.

TABLE 1

| Quantity Qualifier | Hierarchical Name Must Be |
|---|---|
| None | The name of a scalar net |
| potential | The name of a scalar net |
| flow | The name of a terminal or a branch |
| pwr | The name of a subckt or device instance |
| param | The name of a parameter |

The hierarchical name can be in pure Verilog syntax, or can contain VHDL-specific syntax (like: for hierarchical delimiter, {=/=} for index specifier, leading and trailing backslash (\) for escaped name) for mixed-language designs. In on embodiment, For a scalar object, the index, if specified, is ignored. In another embodiment, for a vector object, if the index is not provided and if the object is a bus, some bits of which are analog and some are digital, $cds_analog_exists( ) will return a "no."

As yet another example, another command that can be used to determine the validity of the object is a command to verify that the hierarchical name is that of a scalar object. Accordingly, the testbench can be configured to call a command to verify that the hierarchical name is a scalar object before calling the fetch command. One example of this command is $cds_analog_get_width( ). For example, a function to determine the width of an object can take the form of $cds_analog_get_width(hierarchical_name) and can return the width of the object.

These commands can also be utilized before invoking a fetch command to confirm that the fetch command can in fact be executed with the current design. Accordingly, flexibility can be given for design modifications in some embodiments while avoiding the need to rewrite the testbench as a result of such modifications.

Another function can be included to pass the complete hierarchical name of analog object to a discrete scope. In one embodiment, this function can be configured to return a string and can be used to pass the name of an analog object to a scope that does not recognize the continuous domain. For example, the function can be implemented as $cds_get_node (name[, optional index]). An example is as follows

```
//a.vams
module top;
electrical a;
foo F1(a);
endmodule
module foo(a);
electrical a;
//this passes "top.a" to C1, an inst of the SV module
   myCheck
myCheck #(.netname(Scdsgetnode(a)))C1;
endmodule
//b.sv
module myCheck;
parameter string netname;
always begin
   //Although <netname> refers to an electrical net,
      belonging to
   //continuous discipline, that is NOT recognized by Sys-
      temVerilog,
   //we are able to defer the evaluation of the name by
      passing it
   //as a string
   #3  $display("analog   voltage   is;",   $cds_get_
      analog_value(n name),
      "\n");
end
endmodule
```

Currently most of the complex verification environments are implemented completely using languages that are discrete in nature. These languages include, for example, Verilog, VHDL, SystemVerilog, SystemC, e etc. In such languages, there is no concept of continuous discipline, nor is there a way to access quantities such as potential, flow, power etc of an object belonging to the continuous domain. This can prevent mixed-signal verification engineers from seeing the pure analog effects such as, for example, power drain or leakage current from an analog component in the SOC from the testbench. Accordingly, embodiments of the fetch command can be implemented within the testbench to bring such analog expressions into the metric driven methodology like coverage or assertion. Embodiments can be implemented to enable any discrete hardware modeling or verification language to bring in any generic analog quantity such as voltage, current, power or operating-point information as real number and then create assertion, coverage or simple procedural logic with these real numbers.

In further embodiments, the fetch command can be utilized to allow the mixed-signal testbench developer to control the accuracy of the fetched value. Embodiments allow the caller of the system task to apply any of the following controls and force a solution point in the analog solver when each of the specified conditions are satisfied: (1) An actual time in digital's simulation time grid; (2) An analog @cross event specification with full syntax support as described in the Verilog-AMS LRM with direction, tolerance and enable/disable control; and (3) An analog @above event specification with full syntax support as described in the Verilog-AMS LRM with direction, tolerance and enable/disable control.

This approach can be implemented to allow the user to select a balance between performance and accuracy. For example, the command can allow the user to request an actual value or an interpolation between the last accepted solution point in the continuous time solver and the time of request as provided by the discrete event driven simulator.

As noted above, embodiments can include a set of additional commands or helper functions that allow users to develop reusable testbenches. This is made possible in various embodiments by providing system tasks that can uniquely determine if a given name is qualified for the value fetch functionality by ensuring that it is a scalar object belonging to the continuous domain. Furthermore, the use of $cds_get_node( ) helps circumvent the absence of a true SystemVerilog-AMS mixed-signal testbench language by enabling users to pass parameterized names of analog objects in string form so that their evaluation is delayed until elaboration at which time the notion of a continuous domain object is well understood in the simulator.

The below example provides a simple SystemVerilog testbench that instantiates some analog components and attempts to access analog values and use them a discrete context. This example testbench is described below with reference to FIG. 3.

```
module test;
reg clk=1;
real vams_voltage_val;
enum shortint {true, false} vams_voltage_val_valid;
real vams_branch_flow_val;
real spice_device_param_val;
real spice_device_termcur_val;
real spice_subckt_inst_pwr_val;
always
#5 clk=~clk;
top t1( );
initial begin
//Not sure about the existence/analog-ness/scalared-ness
if ($cds_analog_is_valid("test.t1.src1.src")) begin
    static int w=$cds_analog_get_width("test.t1.src1.src");
    if(w>1)begin
        if ($cds_analog_exists("test.t1.src1.src", 0, "potential")) begin
            vams_voltage_val_valid=true;
        end
    end
end
end
always @(posedge clk) begin
if (vams_voltage_val_valid) begin
    //Let us assume that we want a dead accurate value of
        test.t1.src1.src
    //at the posedge of clk and also when an analog enable
        signal is hi
    real t1=$realtime;
    vams_voltage_val=$cds_get_analog_value
        ("test.t1.src1.src",  ["t1"  "@above(V
        (test.t1.src1.enable)-2.5)"]);
end
//If sure about the characteristics of the desired object,
//then on our merry way . . .
vams_branch_flow_val=$cds_get_analog_value
    ("test.t1.R1.br", "flow");
spice_device_param_val=$cds_get_analog_value
    ("test.t1.C1.c2.c1.trise", "param");
spice_device_termcur_val=$cds_get_analog_value
    ("test.t1.C1.c2.c1.1" "flow");
spice_subckt_inst_pwr_val=$cds_get_analog_value
    ("test.t1.C1.c1", "pwr");
end
//Usage of the system task in SVA
spice_device_param_val_check:   assert   property
(@(posedge clk)
    (spice_device_param_val>0));
//Usage of the system task in PSL
//psl vams_voltage_val_cross_check: assert
//always (spice_device_termcur_val>0.000001)
    @(cross($cds_get_analog_value("test.t1.src1.src")-1.25,
    +1));
endmodule
```

Figure 3:
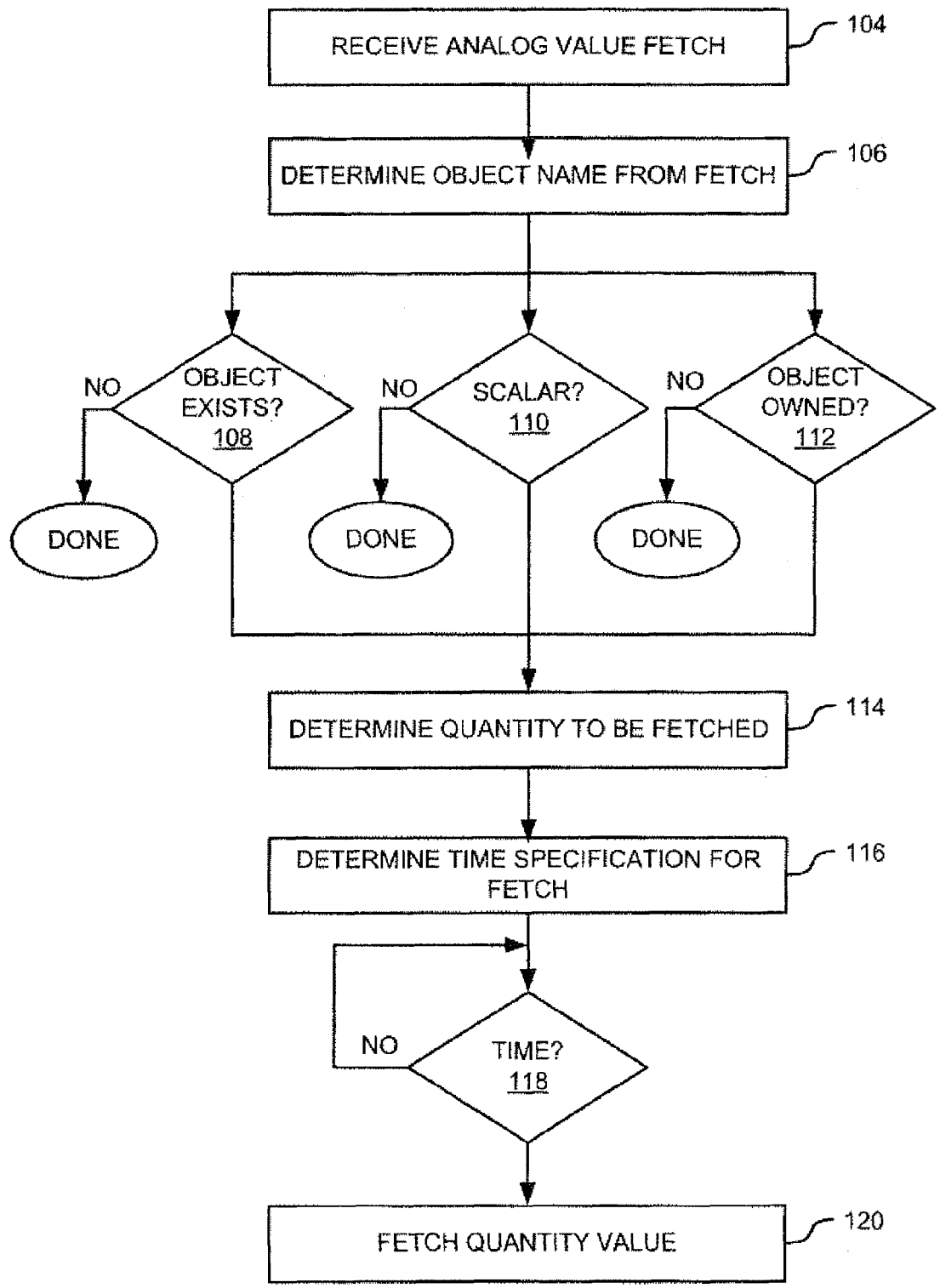
FIG. 3 is a diagram illustrating an example testbench in accordance with one embodiment of the invention.

Referring now to FIG. 3, this example testbench is now described. At operation 104, the test bench encounters an analog value fetch command such as, for example, the fetch command described above with reference to FIGS. 1 and 2. At operation 106, the object name can be determined from the fetch command. In this operation, the test bench determines the object for which a quantity is to be obtained. As noted above, the object can be identified in terms of a hierarchical name in the design.

Next, in this example, helper functions are included and used to verify the validity of the statements. The use of helper functions can allow development of reusable test benches wherein statements can remain valid even if the design and configuration changes. Accordingly, if helper functions are included to validate the object or its properties, in situations where an object no longer exists or has changed due to design changes, the test can determine this before performing the actual fetch operation. In the example code above, and as illustrated in FIG. 3, three helper functions are utilized. At operation 112, the test bench determines whether the analog object is valid and belongs to the analog domain. This is shown in the example by the command if ($cds_analog_is_valid("test.t1.src1.src")) begin. This determines whether the node test.t1.src1.src is a valid node. For example, this function can determine whether the name is valid (for example, check for typos, etc.) and determine whether the node belongs to the analog domain.

At operation 110, the test bench determines whether the object is a scalar. In the above example, the argument static int w=$cds_analog_get_width("test.t1.src1.src"); if (w>1) begin tests the width at node test.t1.src1.src, and if the width is greater than 1, the operation can continue. If not, the fetch operation is not called.

At operation 108, the test bench determines whether the analog object exists. In the example above, the command if ($cds_analog_exists("test.t1 src1.src", 0, "potential")) begin vams_voltage_val_valid=true; tests node test.t1.src1.src to determine whether it can have a potential. For example, in terms of Table 1 referenced above, if the hierarchical name is a scalar net, it can have a potential. If this argument is not true, the fetch operation is not called.

In this example, if the validations are returned verified, at operation 114 the test bench determines the quantity to be fetched. The example above lists four quantities flow, param, flow and pwr to be fetched as: vams_branch_flow_val=$cds_get_analog_value ("test.t1.R1.br", "flow"); spice_device_param_val=$cds_get_analog_value ("test.t1.C1.c2.c1.trise", "param"); spice_device_termcur_val=$cds_get_analog_value ("test.t1.C1.c2.c1.1", "flow"); spice_subckt_inst_pwr_val=$cds_get_analog_value ("test.t1.C1.c1", "pwr"). In some embodiments, these can be fetched as specified values at specified times; these can also be fetched as estimated values, which are sometimes referred to herein as "sloppy" values. For example, if a time constraint is specified in the testbench, the analog solver obtains the object value at the specified time and returns the value. If on the other hand a time constraint is not specified, or if the fetch argument is encountered during execution at a time other than that specified by the argument, the analog solver returns a sloppy value. Such sloppy values can be determined by the analog solver using techniques such as, for example, extrapolation, interpolation or other estimation techniques. The estimates can be based on other values measured for the parameter in interest and speculated values at future time epochs.

At operation 116, the testbench determines the time at which to fetch the specified object quantity. When the designated time occurs as tested at operation 118, the quantity is fetched at operation 120. In the example above, the testbench uses the time_spec argument to control the accuracy of the fetched value, and the analog solver has an @timer event at t1 and also a solution point when the @above event fires. The above example illustrates a scenario where an analog voltage value for the object test.ti.src1.src is to be returned at t1, when the voltage of object test.t1.src1.enable greater than 2.5 volts (i.e., an enable signal is hi) and upon other occurrences during execution. Particularly, this can be seen by the snippet always @(posedge clk) begin
    if (vams_voltage_val_valid) begin
        //Let us assume that we want a dead accurate value of test.t1.src1.src
        //at the posedge of clk and also when an analog enable signal is hi
        real t1=$realtime;
        vams_voltage_val=$cds_get_analog_value
            ("test.t1.src1.src", ["t1" "@above(V(test.t1.src1.enable)−2.5)"]);

in which the object is specified as test.t1.src1.src by the argument vams_voltage_val=$cds_get_analog_value ("test.t1.src1.src", . . . ; and the time constraints are specified as t1 and a high enable signal by ["t1" "@above(V(test.t1.src1.enable)−2.5)"].

As this example illustrates, the testbench can be configured to tell the analog simulator that the digital simulator will be asking for a value (test.t1.src1.src in this example) at many times during a simulation. These can occur when the fetch command is executed as well as at times or events specified by the timing constraint or constraints—for example, at times T1 and at times when V of test.t1.src1.enable is above 2.5 volts. In this example, the "@above" argument specifies a condition, and the event is going to fire when the condition is true. The trigger based on a timing constraint can occur once or multiple times during a simulation.

To illustrate, further assume that the fetch in the above example occurs at time t4 t5 and t6. In this case, the digital simulator expects accurate value of test.t1.src1.src at time t1, and when the enable is high. At other times when the fetch is executed, the analog simulator returns sloppy values.

Accordingly, the testbench in various embodiments is configured to return sloppy values (for example, interpolated values) or values at defined times or events or combinations thereof. Because the retrieval of sloppy values tends to be quicker but less accurate than time-specified values, the testbench can be configured with the accuracy/speed tradeoff in mind. There are instances in verification where sloppy values are not acceptable and more accurate values are required. Accordingly, the testbench can specify time constraints for accurate values and allow the choice between accurate and sloppy values.

Because SoC designs are often multi-language, multi-disciplined designs, the fetch operation may have to cross language boundaries to fetch the desired quantity. For example, where a flow quantity is desired, the command may have to cross levels where there is no notion of current to get to the analog level and fetch the flow quantity.

Figure 4:
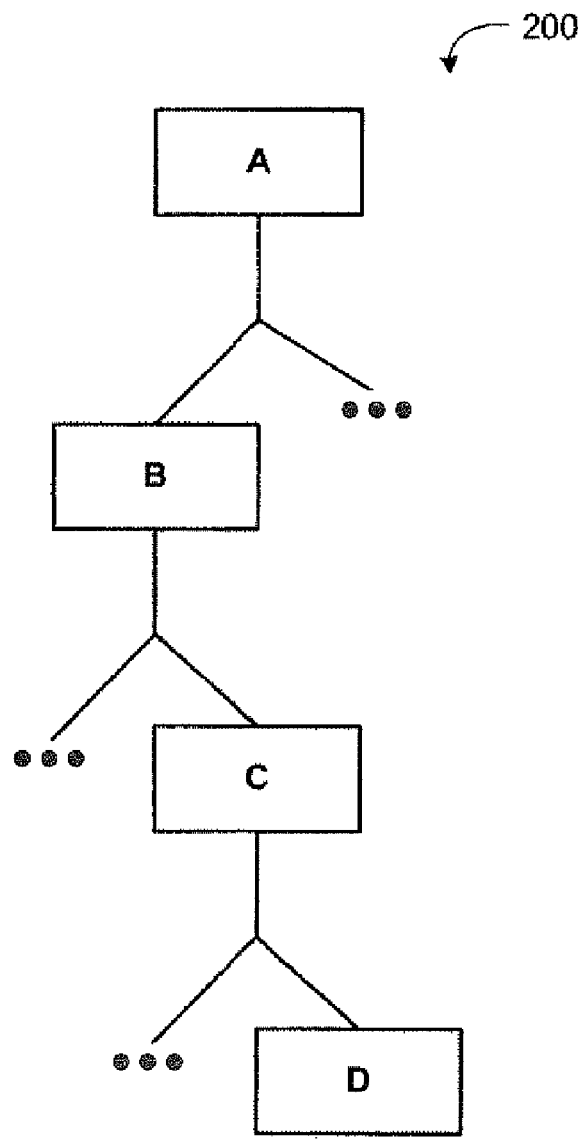
FIG. 4 is a diagram illustrating an example of measuring an analog value in a mixed signal block in accordance with one embodiment of the invention.

FIG. 4 is a diagram illustrating an example of measuring an analog value in a mixed signal block in accordance with one embodiment of the invention In the example of FIG. 4, assume that a design block 200 includes multiple subblocks, A, B, C, D, and so on. Further assume that subblock D is an analog block and for verification purposes it is desired to measure certain continuous parameters in subblock D. Assume for purposes of this example, that the testbench specifies that current through a given node is to be measured in analog subblock D. However, further assume that current is not a valid or recognized parameter in digital subblocks A, B or C. In one embodiment, the node and quantity are enclosed in quotation marks or otherwise identified so that the name is passed as a string by the language that implements the discrete-time blocks (such as A, B or C) and these blocks do not attempt to evaluate the notion of current or flow.

In the above-described examples, the node and the quantity are enclosed in quotation marks so that the name is passed as a string by the language that implements the discrete-time blocks (such as A, B or C) and this language does not attempt to process the value. The argument becomes a call to the analog simulator, which knows what potential, pwr, flow, etc. means. Accordingly, the command can be passed through the language that implements the discrete-time blocks and processed by the analog simulator. Preferably, the quantity is returned as a real number. Also, in various embodiments the return value of the function is a real number, which is generally accepted by hardware description languages as a valid data type.

Figure 5:
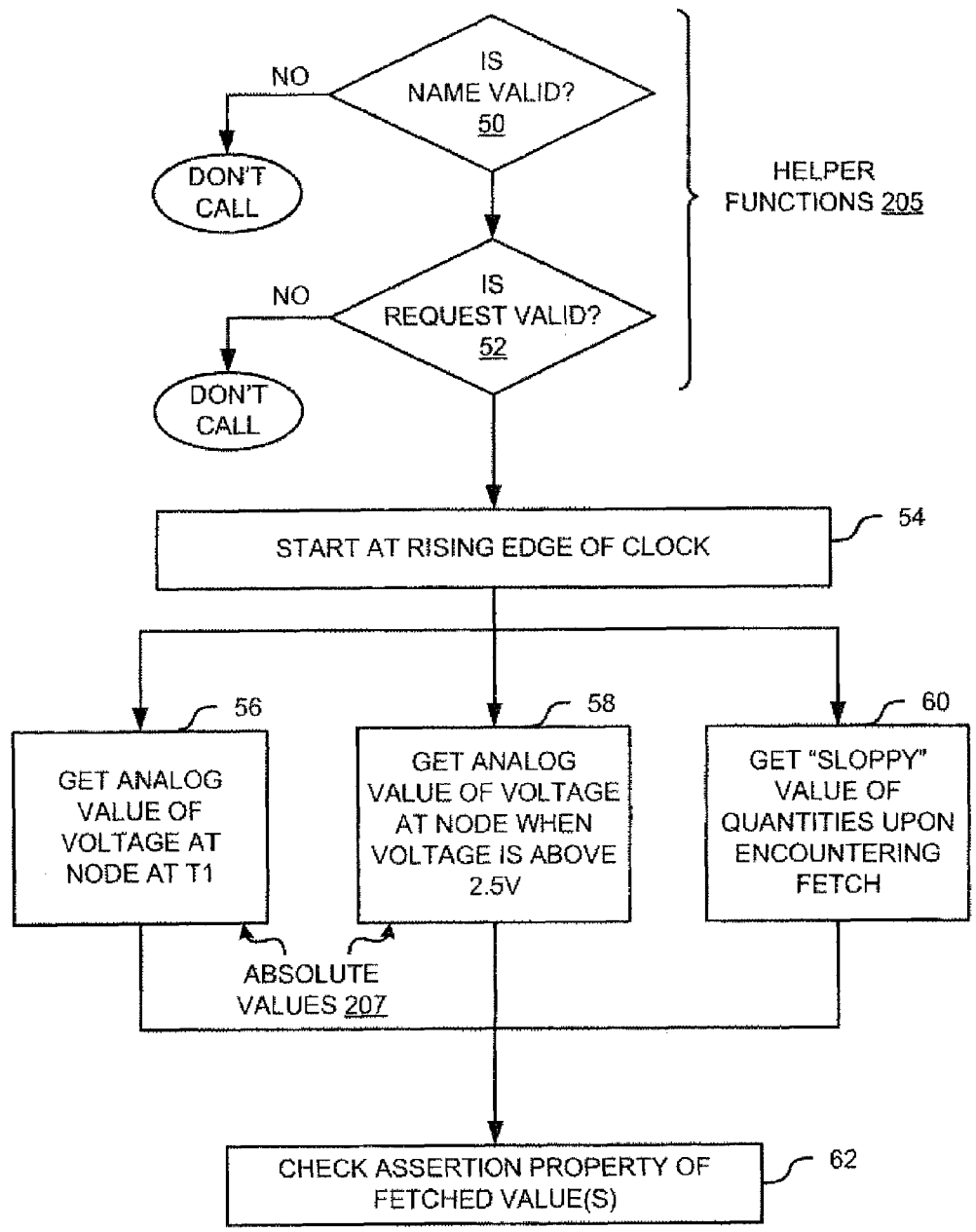
FIG. 5 is a diagram illustrating an example operational flow for an object fetch in accordance with one embodiment of the invention.

FIG. 5 is a diagram illustrating an example operational flow for an object fetch in accordance with one embodiment of the invention. Particularly, FIG. 5 illustrates an example of using helper functions 205 to validate the object and request, and the option of obtaining absolute values 207 instead of or in addition to sloppy values or estimates.

Referring now to FIG. 5 in step 50 test bench first determines whether the object name is valid. In step 52 the test bench determines if the request is valid. In either of these two steps the test bench determines the validity of the fetch operation in process and if the name of the object or the request is invalid the fetch operation is not called and the test bench moves on with the next operation. If these parameters are valid, the test bench processes the fetch command to fetch the specified values.

The examples of values that can be fetched by the test bench as shown in FIG. 5 include absolute values 207 as well as sloppy values or estimates. The examples of the absolute values shown are measuring a value at the rising edge of a clock as shown in step 54, obtaining an analog value of a parameter such as voltage at a node at a given time T1 as shown in operation 56, obtaining an analog value such as a voltage value at a node when a threshold is reached such as when an enable voltage is above 2.5 V as shown in operation 58. In operation 60, sloppy values can be fetched when the fetch command is encountered but a time constraint is either unspecified or unmet. When a given value is fetched, in step 62 and the searching property of the fetched value can be checked in the test bench to verify operation of the circuit.

The term tool can be used to refer to any apparatus configured to perforin a recited function. For example, tools can include a collection of one or more modules and can also be comprised of hardware, software or a combination thereof. Thus, for example, a simulation and verification tool can be a collection of one or more software modules, hardware modules, software/hardware modules or any combination or permutation thereof. As another example, a tool can be a computing device or other appliance on which software runs or in which hardware is implemented.

Figure 6:
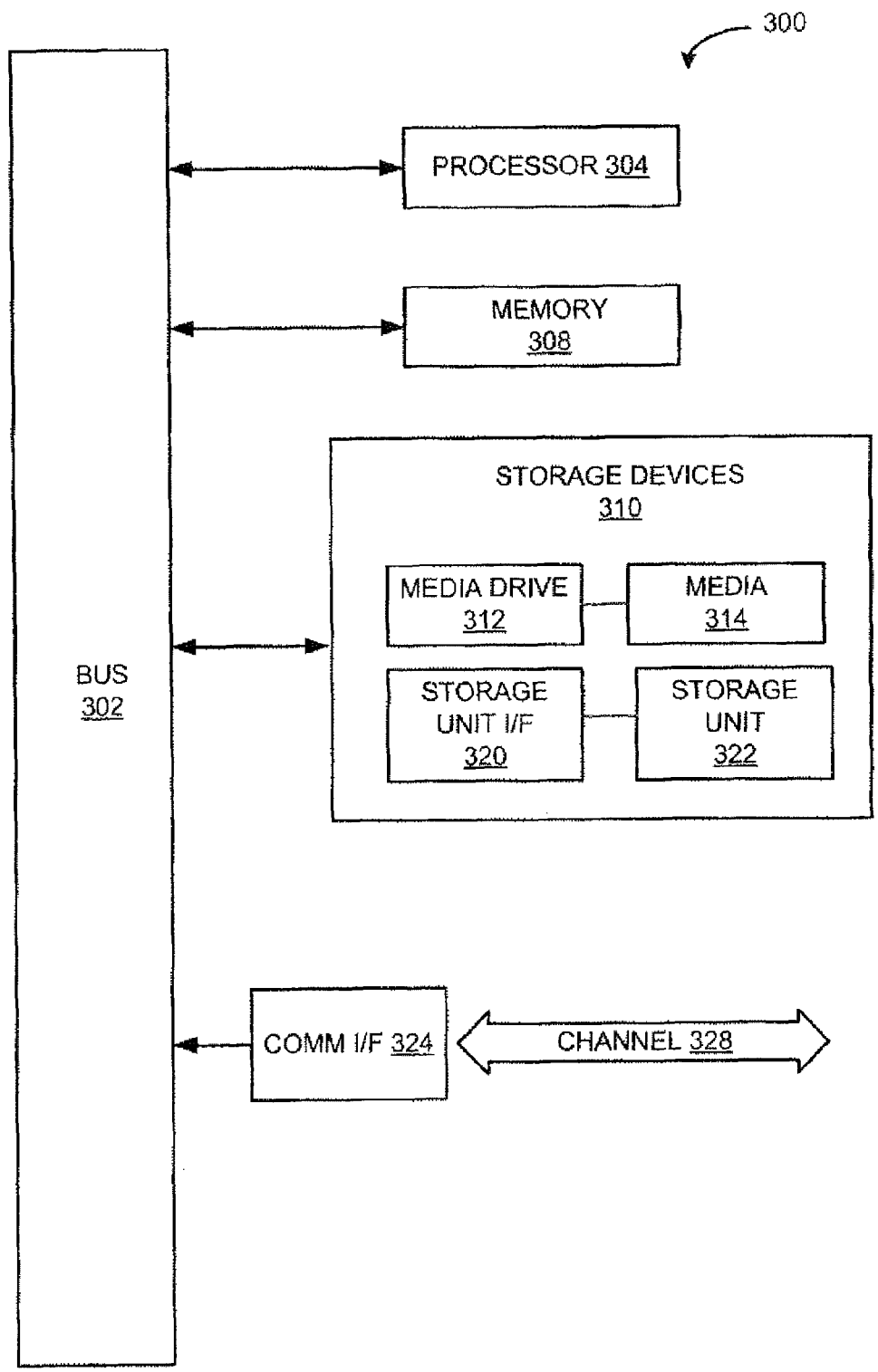
FIG. 6 is a diagram illustrating an example computing module in accordance with the systems and methods described herein.

As used herein, the term module describes a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example-computing module is shown in FIG. 6. Various embodiments are described in terms of this example-computing module 300. After reading this description, it will become apparent to a person skilled in the relevant art how to implement the invention using other computing modules or architectures.

Referring now to FIG. 6, computing module 300 may represent, for example, computing or processing capabilities found within desktop, laptop and notebook computers; handheld computing devices (PDA's, smart phones, cell phones, palmtops, and other handheld computing devices); mainframes, supercomputers, workstations or servers; or any other type of special-purpose or general-purpose computing devices as may be desirable or appropriate for a given application or environment. Computing module 300 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 300 might include, for example, one or more processors, controllers, control modules, or other processing devices, such as a processor 304. Processor 304 might be implemented using a general-purpose or special-purpose processing engine such as, for example, a microprocessor, controller, or other control logic. In the example illustrated in FIG. 3, processor 304 is connected to a bus 302, although any communication medium can be used to facilitate interaction with other components of computing module 300 or to communicate externally.

Computing module 300 might also include one or more memory modules, simply referred to herein as main memory 308. For example, preferably random access memory (RAM) or other dynamic memory, might be used for storing information and instructions to be executed by processor 304. Main memory 308 might also be used for storing temporary variables or other intermediate information during execution of instructions to be executed by processor 304. Computing module 300 might likewise include a read only memory ("ROM") or other static storage device coupled to bus 302 for storing static information and instructions for processor 304.

The computing module 300 might also include one or more various forms of information storage mechanism 310, which might include, for example, a media drive 312 and a storage unit interface 320. The media drive 312 might include a drive or other mechanism to support fixed or removable storage media 314. For example, a hard disk drive, a floppy disk drive, a magnetic tape drive, an optical disk drive, a CD or DVD drive (R or RW), or other removable or fixed media drive might be provided. Accordingly, storage media 314, might include, for example, a hard disk, a floppy disk, magnetic tape, cartridge, optical disk, a CD or DVD, or other fixed or removable medium that is read by, written to or accessed by media drive 312. As these examples illustrate, the storage media 314 can include a computer usable storage medium having stored therein computer software or data.

In alternative embodiments, information storage mechanism 310 might include other similar instrumentalities for allowing computer programs or other instructions or data to be loaded into computing module 300. Such instrumentalities might include, for example, a fixed or removable storage unit 322 and an interface 320. Examples of such storage units 322 and interfaces 320 can include a program cartridge and cartridge interface, a removable memory (for example, a flash memory or other removable memory module) and memory slot, a PCMCIA slot and card, and other fixed or removable storage units 322 and interfaces 320 that allow software and data to be transferred from the storage unit 322 to computing module 300.

Computing module 300 might also include a communications interface 324. Communications interface 324 might be used to allow software and data to be transferred between computing module 300 and external devices. Examples of communications interface 324 might include a modem or soft modem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 324 might typically be carried on signals, which can be electronic, electromagnetic (which includes optical) or other signals capable of being exchanged by a given communications interface 324. These signals might be provided to communications interface 324 via a channel 328. This channel 328 might carry signals and might be implemented using a wired or wireless communication medium. These signals can deliver the software and data from memory or other storage medium in one computing system to memory or other storage medium in computing system 300. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to physical storage media such as, for example, memory 908, storage unit 920, and media 914. These and other various forms of computer program media or computer usable media may be involved in storing one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 900 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be used to implement the desired features of the present invention. Also, a multitude of different constituent module names other than those depicted herein can be applied to the various partitions. Additionally, with regard to flow diagrams and operational descriptions, the order in which the steps are presented herein shall not mandate that various embodiments be implemented to perform the recited functionality in the same order unless the context dictates otherwise.

Although the invention is described above in tee ins of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

What is claimed is:

1. An analog mixed signal testbench embodied on a computer readable physical medium and configured to fetch values of object quantities for an object of an analog circuit in an analog mixed signal design, the testbench comprising:
    a fetch command embodied on the computer readable physical medium wherein the fetch command comprises a first argument specifying an analog object to be fetched from an analog block in the analog mixed signal design;
    a validation argument embodied on the computer readable physical medium wherein the validation argument comprises an argument to test the existence of the object specified by the fetch command as a condition precedent to performing a fetch operation in response to the fetch command;
    a quantity argument embodied on the computer readable physical medium specifying a quantity for the analog object to be fetched and returned for verification by the test bench; and
    a verification rule embodied on the computer readable physical medium to test the quantity returned to the test bench for verification.

2. The analog mixed signal testbench of claim 1, further comprising a timing constraint embodied on the computer readable physical medium specifying a timing event at which the specified quantity is to be fetched from a specified node.

3. The analog mixed signal testbench of claim 2, wherein the timing constraint comprises specification of an absolute time in a simulation or the occurrence of an event.

4. The analog mixed signal testbench of claim 3, wherein the event specified by the timing constraint comprises a threshold event, a rising or falling edge event or a node quantity.

5. The analog mixed signal testbench of claim 1, wherein the fetch command is further configured to return an estimated value of the quantity, the estimate calculated based on an actual value for the quantity.

6. The analog mixed signal testbench of claim 5, wherein the estimate comprises an extrapolation from a known value or an interpolation between a known value and a future speculated value.

7. A system design tool for simulating and verifying an analog mixed signal circuit design comprising:
    a memory configured to store program instructions; and
    a processor coupled to the memory and configured to receive and execute the program instructions, wherein the program instructions comprise an analog mixed signal test bench configured to verify analog parameters of an analog circuit in an analog mixed signal design, the test bench comprising:
        a fetch command embodied on the computer readable physical medium wherein the fetch command comprises a first argument specifying an analog object to be fetched from an analog block in the analog mixed signal design;
        a validation argument embodied on the computer readable physical medium wherein the validation argument comprises an argument to test the existence of the object specified by the fetch command as a condition precedent to performing a fetch operation in response to the fetch command;
        a quantity argument embodied on the computer readable physical medium specifying a quantity for the analog object to be fetched and returned for verification by the test bench; and
        a verification rule embodied on the computer readable physical medium to test the quantity returned to the test bench for verification.

8. The system design tool of claim 7, further comprising a timing constraint embodied on the computer readable physical medium specifying a timing event at which the specified quantity is to be fetched from a specified node.

9. The system design tool of claim 8, wherein the timing constraint comprises specification of an absolute time in a simulation or the occurrence of an event.

10. The system design tool of claim 9, wherein the event specified by the timing constraint comprises a threshold event, a rising or falling edge event or a node quantity.

11. The system design tool of claim 7, wherein the fetch command is further configured to return an estimated value of the quantity, the estimate calculated based on an actual value for the quantity.

12. The system design tool of claim 11, wherein the estimate comprises an extrapolation from a known value or an interpolation between a known value and a future speculated value.

13. A computer readable physical medium comprising computer executable instructions stored thereon, the computer executable instructions comprising an analog mixed signal test bench adapted to cause a computer to:
    receive a fetch command comprising an argument specifying an analog object in an analog block in an analog mixed signal design;
    test the existence of the object specified by the fetch command as a condition precedent to performing a fetch operation in response to the fetch command;
    determine a quantity for the analog object to be fetched and returned for verification by the test bench; and
    test the quantity returned to the test bench for verification.

14. The computer readable physical medium of claim 13, wherein the testbench is further adapted to specify a timing event at which the specified quantity is to be fetched from a specified node.

15. The computer readable physical medium of claim 14, wherein the timing constraint comprises specification of an absolute time in a simulation or the occurrence of an event.

16. The computer readable physical medium of claim 15, wherein the event specified by the timing constraint comprises a threshold event, a rising or falling edge event or a node quantity.

17. The computer readable physical medium claim 13, wherein the testbench is further adapted to receive an estimated value of the quantity, the estimate calculated based on an actual value for the quantity.

18. The method of claim 15, wherein the event specified by the timing constraint comprises a threshold event, a rising or falling edge event or a node quantity.

19. A computer implemented method for verifying analog parameters of an analog circuit in an analog mixed signal design, the method comprising the steps of:
    a computing system receiving a fetch command comprising an argument specifying an analog object in an analog block in the analog mixed signal design;
    the computing system testing the existence of the object specified by the fetch command as a condition precedent to performing a fetch operation in response to a fetch command;
    the computing system determining a quantity for the analog object to be fetched and returned for verification by the test bench; and
    the computing system testing the quantity returned to the test bench for verification.

20. The method of claim 19, wherein the testbench is further adapted to specify a timing event at which the specified quantity is to be fetched from a specified node.

21. The method of claim 20, wherein the timing constraint comprises specification of an absolute time in a simulation or the occurrence of an event.

22. The method of claim 19, wherein the testbench is further adapted to receive an estimated value of the quantity, the estimate calculated based on an actual value for the quantity.

* * * * *